(12) United States Patent
Yazawa et al.

(10) Patent No.: US 9,387,584 B2
(45) Date of Patent: Jul. 12, 2016

(54) INDUSTRIAL ROBOT

(71) Applicant: NIDEC SANKYO CORPORATION, Nagano (JP)

(72) Inventors: Takayuki Yazawa, Nagano (JP); Masago Shiba, Nagano (JP); Hiroto Nakajima, Nagano (JP); Masashi Fujiwara, Nagano (JP)

(73) Assignee: NIDEC SANKYO CORPORATION (JP)

( * ) Notice: Subject to any disclaimer, the term of this patent is extended or adjusted under 35 U.S.C. 154(b) by 0 days.

(21) Appl. No.: 14/358,867

(22) PCT Filed: Nov. 1, 2012

(86) PCT No.: PCT/JP2012/078305
§ 371 (c)(1),
(2) Date: May 16, 2014

(87) PCT Pub. No.: WO2013/073379
PCT Pub. Date: May 23, 2013

(65) Prior Publication Data
US 2014/0312640 A1      Oct. 23, 2014

Related U.S. Application Data

(60) Provisional application No. 61/560,402, filed on Nov. 16, 2011.

(30) Foreign Application Priority Data

Mar. 13, 2012   (JP) ................................. 2012-055523

(51) Int. Cl.
*B66F 19/00*           (2006.01)
*B25J 9/00*            (2006.01)
(Continued)

(52) U.S. Cl.
CPC ................ *B25J 9/0012* (2013.01); *B25J 9/108* (2013.01); *B25J 19/0054* (2013.01); *B25J 21/00* (2013.01);
(Continued)

(58) Field of Classification Search
CPC ...... B25J 9/0012; B25J 9/108; B25J 19/0054; B25J 21/00; C03B 35/207; H01L 21/67742; Y10T 74/20329; Y10S 901/27
USPC .............. 294/213, 902; 414/941, 936; 901/39
See application file for complete search history.

(56) References Cited

U.S. PATENT DOCUMENTS 5,929,456 A      7/1999   Tamai
6,183,026 B1 *   2/2001   Cai et al. ........................ 294/183
(Continued)

FOREIGN PATENT DOCUMENTS

JP      6-204316 A      7/1994
JP      11-195687 A     7/1999
(Continued)

OTHER PUBLICATIONS

International Search Report for International Application No. PCT/JP2012/078301; Date of Mailing, Jan. 29, 2013 with English translation.
(Continued)

*Primary Examiner* — Gabriela Puig
(74) *Attorney, Agent, or Firm* — Cantor Colburn LLP

(57) ABSTRACT

An industrial robot may include a hand having an object-mounting section; an arm structured to hold the hand at the front side thereof; a main body section structured to hold the base end of the arm; and a covering member structured to cover at least the top surface of the object-mounting section. The radiant heat reflectance at the covering member may be higher than that at the object-mounting section. The heat conductivity of the covering member may be lower than that of the object-mounting section. The specific gravity of the object-mounting section may be smaller than that of the covering member.

7 Claims, 7 Drawing Sheets

(51) Int. Cl.
*B25J 21/00* (2006.01)
*C03B 35/20* (2006.01)
*H01L 21/677* (2006.01)
*B25J 9/10* (2006.01)
*B25J 19/00* (2006.01)

(52) U.S. Cl.
CPC ........ *C03B 35/207* (2013.01); *H01L 21/67742* (2013.01); *Y10S 901/27* (2013.01); *Y10T 74/20329* (2015.01)

(56) References Cited

U.S. PATENT DOCUMENTS

| | | | |
|---|---|---|---|
| 6,322,116 B1 * | 11/2001 | Stevens | 294/64.3 |
| 7,073,834 B2 * | 7/2006 | Matsumoto et al. | 294/213 |
| 7,401,828 B2 * | 7/2008 | Yang | 294/119.1 |
| 7,520,545 B2 * | 4/2009 | Kim | 294/213 |
| 8,156,840 B2 | 4/2012 | Tange | |
| 8,276,959 B2 * | 10/2012 | Kim | 294/183 |
| 8,465,072 B2 * | 6/2013 | Wu et al. | 294/213 |
| 8,814,239 B2 * | 8/2014 | Forderhase et al. | 294/87.1 |
| 2010/0068025 A1 * | 3/2010 | Miyamoto et al. | 414/749.1 |
| 2010/0247280 A1 | 9/2010 | Liu et al. | |

FOREIGN PATENT DOCUMENTS

| | | | |
|---|---|---|---|
| JP | 2001035902 A | | 2/2001 |
| JP | 2001-189367 A | | 7/2001 |
| JP | 2006062183 A | | 3/2006 |
| JP | 2007-91433 A | | 4/2007 |
| JP | 2007082954 A | | 4/2007 |
| JP | 2008021216 A | | 1/2008 |
| JP | 2008120294 A | | 5/2008 |
| JP | 2009-43799 A | | 2/2009 |
| JP | 2010-23195 A | | 2/2010 |
| JP | 2011093075 A | | 5/2011 |
| JP | 2011-187910 A | | 9/2011 |
| WO | 2006/062183 a1 | | 6/2006 |
| WO | 2008/021216 A2 | | 2/2008 |
| WO | 2008/120294 A1 | | 10/2008 |

OTHER PUBLICATIONS

International Search Report for International Application No. PCT/JP2012/078305; Date of Mailing, Jan. 29, 2013 with English translation.
Japanese Notice of Refusal corresponding to Application No. 2012-029043; Dated: Jan. 5, 2016, with English remarks.
US Notice of Allowance corresponding to U.S. Appl. No. 14/358,820; Date of Mailing: Mar. 21, 2016.

* cited by examiner

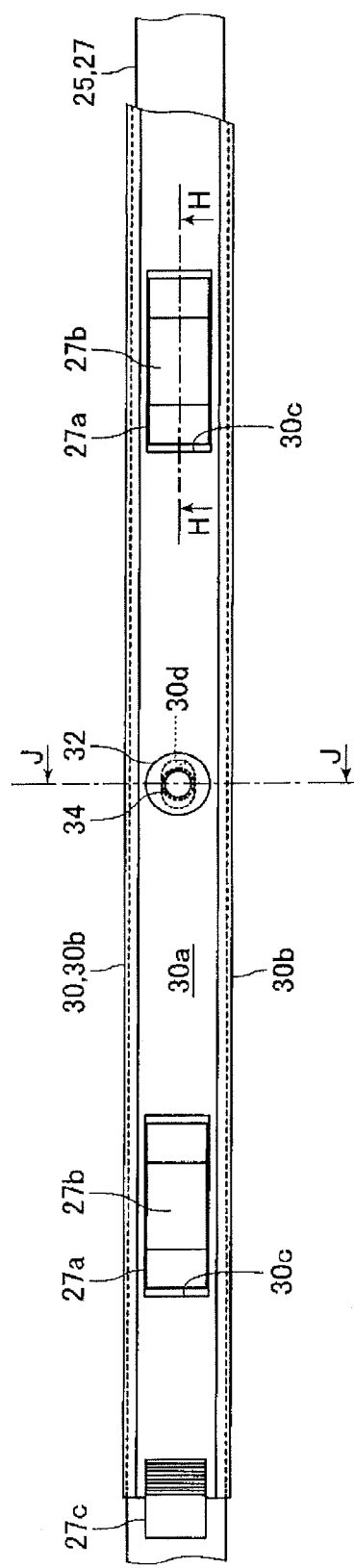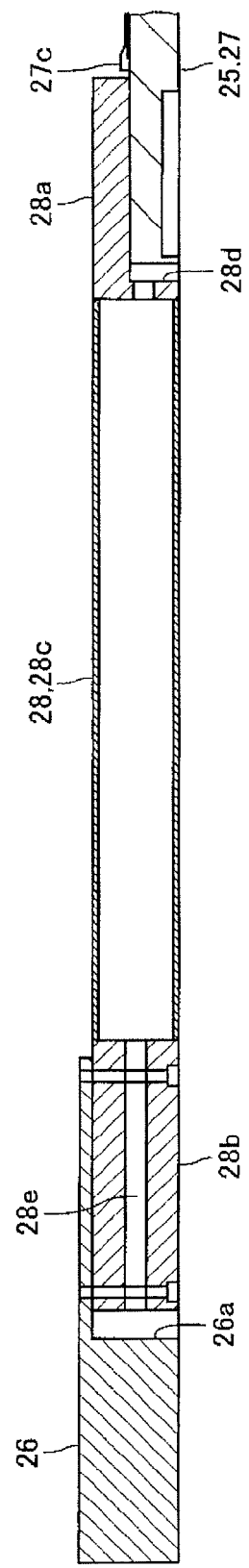
Fig. 4 (A)
Fig. 4 (B)

INDUSTRIAL ROBOT

CROSS REFERENCE TO RELATED APPLICATIONS

This is the U.S. national stage of application No. PCT/JP2012/078305, filed on Nov. 1, 2012. Priority under 35 U.S.C. §119 and 35 U.S.C. §365 is claimed from Japanese Application No. 2012-055523, filed Mar. 13, 2012, and U.S. Provisional Application No. 61/560,402, filed Nov. 16, 2011, the disclosures of which are also incorporated herein by reference.

FIELD OF THE INVENTION

The present invention relates to an industrial robot for transferring predetermined objects-to-be-transferred.

BACKGROUND

Conventionally known is a heat-resistant robot hand used in a semiconductor fabricator for moving material-to-be-heated, such as semiconductor wafers, out of or into a pressure-reduced, highly-heated chamber (referring to Patent reference 1, for example). A robot hand disclosed in Patent reference 1 is provided with a hand for supporting a material-to-be-heated via heat-insulating seats, and a heat reflection plate arranged on the top face of the hand and supported by the hand via a heat-insulating support means. Also, this robot hand is attached to an arm, which moves the robot hand out of and/or into a chamber, via a heat-insulating collar. The robot hand disclosed in Patent reference 1 is capable of reducing the amount of heat that is transmitted from the robot hand to the arm, with functions of the seats, the heat reflection plate, the heat-insulating support member and the heat-insulating collar.

Known also is an industrial robot for transferring glass substrates for LCDs (referring to Patent reference 2, for example). An industrial robot disclosed in Patent reference 2 is provided with a hand on which a glass substrate is mounted, an arm to which the hand is rotatably joined to the front end thereof, and a main body section to which the base end of the arm is rotatably joined. The arm is configured by a first arm section and a second arm section; the base end of the first arm section is rotatably joined to the main body section and the base end of the second arm section is rotatably joined to the front end side of the first arm section. In the joint which is a connecting section between the main body section and the first arm section, a rolling bearing is arranged to rotatably support the first arm section; in the joint which is a connecting section between the first arm section and the second arm section, a rolling bearing is arranged to rotatably support the second arm section.

PATENT REFERENCE

[Patent reference 1] Unexamined Japanese Patent Application H6-204316 Publication
[Patent reference 2] Unexamined Japanese Patent Application 2010-23195 Publication In recent years, glass substrates, which are transferred by an industrial robot such as the one disclosed in Patent reference 2, have been upsized, and the temperature of the glass substrates during the transfer tends to be higher and therefore the amount of heat of the glass substrate in transfer is increased. If high heat is transmitted from the glass substrate to the arm through heat conduction via the hand and the high heat is applied to the bearing arranged in the joint, rigidity of the hardened bearing may be degraded or viscosity of the grease inside the bearing may be degraded causing oil shortage; therefore, the bearing may easily become worn or damaged. Also, if high heat is transmitted from the glass substrate to the arm through heat conduction via the hand, the arm may become badly deformed, and as a result, precision in transferring the glass substrate may be degraded.

The amount of heat that is transmitted from the glass substrate to the arm through heat conduction via the hand can be reduced by adopting the configuration of the heat-resistant robot hand, which is disclosed in Patent reference 1, to the industrial robot disclosed in Patent reference 2. Consequently, the bearing arranged in the joint won't become excessively worn or damaged or the arm won't become badly deformed. However, the heat-resistant robot hand disclosed in Patent reference 1 is used in an industrial robot which transfers a relatively small-sized object-to-be-transferred, such as semiconductor wafers; in Patent reference 1, a specific configuration to reduce wear or damage to the bearing resulting from the effects of heat or deformation of the arm resulting from the effects of heat has not been proposed in an industrial robot which transfers a relatively upsized object-to-be-transferred, such as a glass substrate for LCDs.

Then, at least an embodiment the present invention provides an industrial robot which, even when transferring a high-temperature, upsized object-to-be-transferred, is capable of suppressing wear or damage to a bearing resulting from the effects of heat and suppressing deformation of an arm resulting from the effects of heat, and reducing the weight of the hand.

To solve the above-mentioned problems, an industrial robot of at least an embodiment of the present invention comprises, in an industrial robot for transferring an object-to-be-transferred, a hand having an object-mounting section on which an object-to-be-transferred is placed, an arm for holding the hand with the front end side thereof, a main body section for holding the base end side of the arm, and a covering member for covering at least the top surface of the object-mounting section; wherein the radiant heat reflectance of the covering member is higher than the radiant heat reflectance of the object-mounting section; the heat conductivity of the covering member is lower than the heat conductivity of the object-mounting section; and the specific weight of the object-mounting section is smaller than that of the covering member.

The industrial robot of at least an embodiment of the present invention comprises a hand having an object-mounting section on which an object-to-be-transferred is placed and a covering member for covering at least the top surface of the mounting section, and the radiant heat reflectance of the covering member is higher than the radiant heat reflectance of the mounting section and the heat conductivity of the covering member is lower than the heat conductivity of the mounting section. Therefore, the amount of heat that is transmitted from the object-to-be-transferred to the object-mounting section through radiant heat transfer or heat conduction can be reduced by the use of the covering member. As a result, the amount of heat that is transmitted from the object-to-be-transferred to the arm through heat conduction via the hand can be reduced. Thus, even when transferring an object-to-be-transferred of high temperature, wear or damage to the bearing resulting from the effects of heat can be suppressed, and deformation of the arm resulting from the effects of heat can be suppressed.

Also, the specific gravity of the object-mounting section is smaller than the specific gravity of the covering member in at least an embodiment of the present invention. Therefore, even if the hand is made larger in order to transfer a relatively large object-to-be-transferred, the weight of the hand can be reduced in at least an embodiment of the present invention. In other words, even when the same material as the covering member is used for the object-mounting section, the amount of heat that is transmitted from the object-to-be-transferred to the arm through heat conduction via the hand can be reduced; however, if the hand that transfers a relatively large object-to-be-transferred is made larger, the weight of the hand becomes heavier. In at least an embodiment of the present invention, however, the weight of the hand can be reduced even when the hand is made larger in order to transfer a relatively large object-to-be-transferred.

It is preferred in at least an embodiment of the present invention that the covering member cover the top surface and side surface of the object-mounting section. With this, the amount of heat that is transmitted from the object-to-be-transferred to the object-mounting section through radiant heat transfer can be effectively reduced.

In at least an embodiment of the present invention, the object-mounting section is formed of ceramic and the covering member is formed of a stainless steel sheet, for example. Also, in at least an embodiment of the present invention, the hand is provided with multiple fork prongs and a hand base section to which the base end of the multiple fork prongs are fixed and which is held at the front end of the arm; at least the front side portion of the fork prong is the object-mounting section.

It is preferred in at least an embodiment of the present invention that the fork prong be provided with a fork prong front section as the object-mounting section and a fork prong base section to which the base end of the fork prong front section is fixed and at least a portion of the fork prong base section be formed hollow. With this, the cross-sectional area of at least part of the fork prong base section becomes small and accordingly the heat conduction passage in at least part of the fork prong base section becomes narrower. Therefore, the amount of heat that is transmitted through heat conduction from the fork prong front side, on which the object-to-be-transferred is mounted, to the hand base held at the front end of the arm can be effectively reduced. Consequently, the amount of heat transmitted from the hand to arm through heat conduction can be effectively reduced. Also, with this configuration, the strength of the fork prong base section can be ensured while the weight of the fork prong base section is reduced. Note that Patent reference 1 has not proposed specific configurations for suppressing wear or damage to the bearing resulting from the effects of heat or suppressing deformation of the arm resulting from the effects of heat in an industrial robot provided with a hand having fork prongs.

It is preferred in at least an embodiment of the present invention that the radiant heat reflectance at the fork prong base section be higher than that at the fork prong front section, the heat conductivity of the fork prong base section be lower than that of the fork prong front section, and the specific gravity of the fork prong front section be smaller than that of the fork prong base section. With this configuration, even if the fork prong base section is not covered by the covering member, the amount of heat that is transmitted from the object-to-be-transferred to the hand base through radiant heat transfer or heat conduction can be reduced; as a result, the amount of heat transmitted from the object-to-be-transferred to the arm through heat conduction via the hand can be effectively reduced.

In at least an embodiment of the present invention, the fork prong front section is formed of ceramic and at least a portion of the fork prong base section is formed of a stainless steel pipe, for example.

It is preferred in at least an embodiment of the present invention that the industrial robot be equipped with a second covering member to cover at least the top face of the arm and the heat conductivity of the second covering member be lower than that of the arm. With this configuration, the amount of heat transmitted from the object-to-be-transferred to the arm through radiant heat transfer can be reduced by the use of the second covering member. Note that Patent reference 1 has not proposed specific configurations to reduce the amount of heat that is transmitted from the object-to-be-transferred to the arm through radiant heat transfer.

In at least an embodiment of the present invention, the object-to-be-transferred is a glass substrate for LCDs, for example. As mentioned earlier, glass substrates an industrial robot transfers have more heat in recent years; however, even if a glass substrate to be transferred has larger amount of heat, wear or damage to the bearing resulting from the effects of heat can be suppressed and deformation of the arm resulting from the effects of heat can also be suppressed according to at least an embodiment of the present invention. Also, glass substrates that are to be transferred have been upsized in recent years; in at least an embodiment of the present invention, even when the hand is made larger in order to transfer the upsized glass substrates, the weight of the hand can be reduced.

Embodiments will now be described, by way of example only, with reference to the accompanying drawings which are meant to be exemplary, not limiting, and wherein like elements are numbered alike in several Figures, in which:

As described above, even when the industrial robot of at least an embodiment of the present invention is used for transferring a relatively large object-to-be-transferred of high temperature, wear and damage to the bearing resulting from the effects of heat can be suppressed, deformation of the arm resulting from the effects of heat can be suppressed, and the weight of the hand can be reduced.

BRIEF DESCRIPTION OF THE DRAWING

FIG. 4(A) is an enlargement of F section of FIG. 3; FIG. 4(B) is a cross-sectional view of G-G cross-section in FIG. 3.

DETAILED DESCRIPTION

Figure 1:
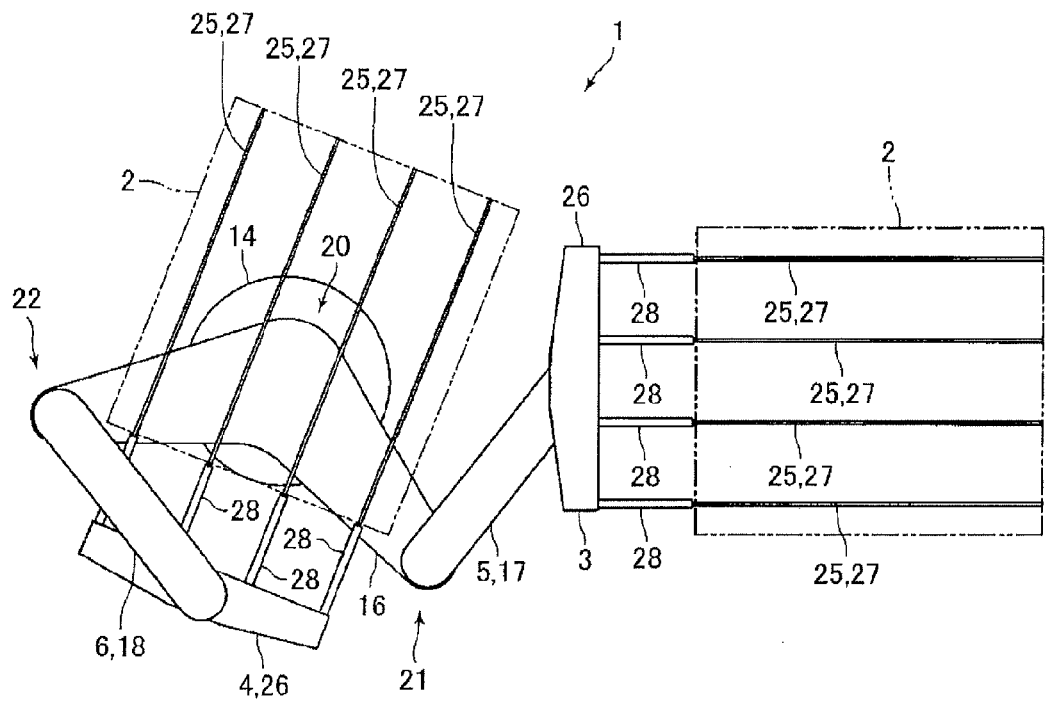
FIGS. 1(A) and 1(B) are plan views of an industrial robot of an embodiment of the present invention.
Figure 1:
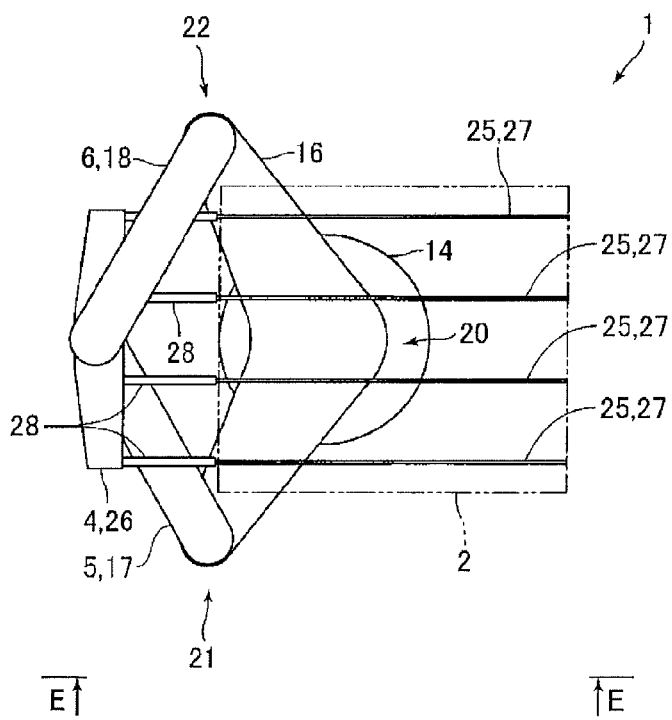

At least an embodiment of the present invention is described in detail hereinafter referring to the drawings.
(Configuration of Industrial Robot)

Figure 2:
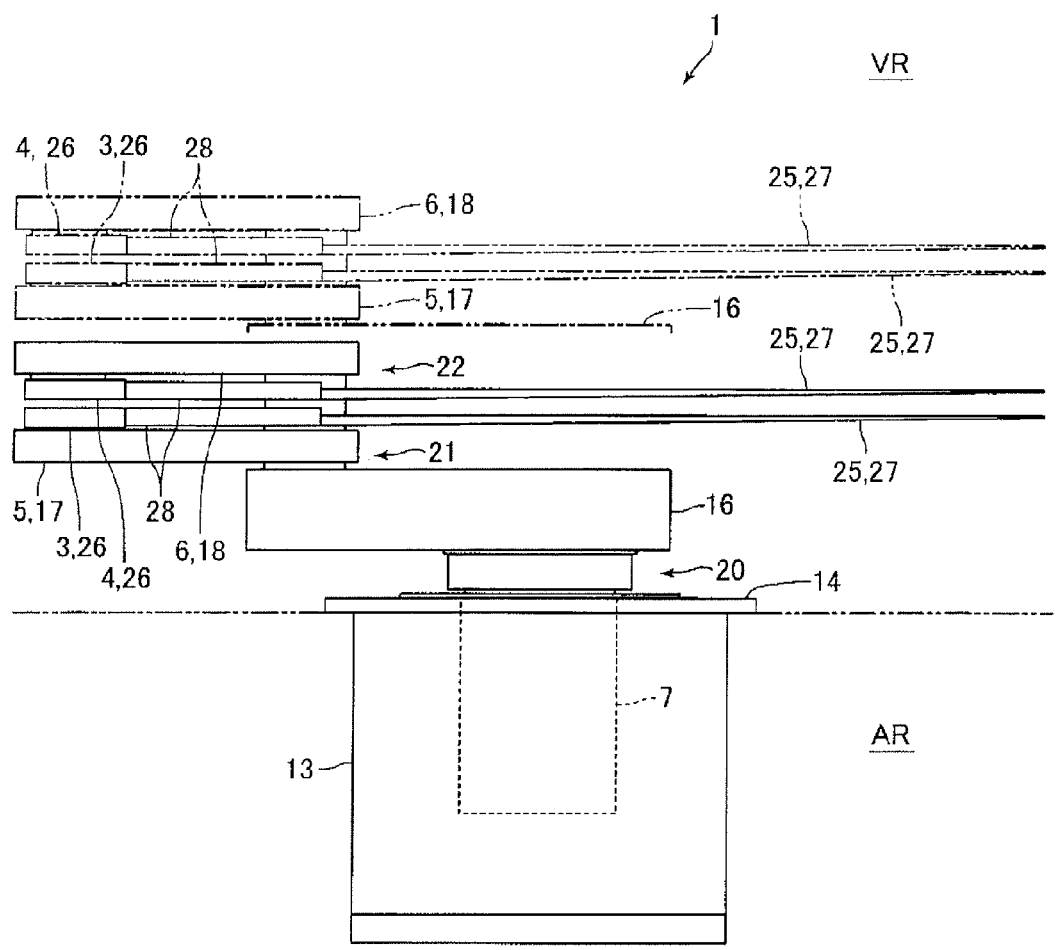
FIG. 2 is a side view of the industrial robot, observed in the E-E direction of FIG. 1 (B).

FIG. 1 shows plan views of an industrial robot 1 of an embodiment of the present invention. FIG. 2 shows a side view of the industrial robot observed in the E-E direction shown in FIG. 1 (B).

An industrial robot 1 of this embodiment (denoted as "robot 1" hereinafter) is a robot for transferring a glass substrate for LCD 2 (denoted as "substrate 2" hereinafter) which is an object-to-be-transferred. The robot 1 of this embodiment is a large-sized robot suitable for transferring the upsized substrate 2 in particular; it transfers a rectangular substrate 2 having a side of 2.5 m. Also, the robot 1 is suitable for transferring a substrate 2 of relatively high temperature; it transfers a substrate 2 of about 500° C., for example. The robot 1 also transfers a substrate 2 in vacuo.

As shown in FIG. 1 and FIG. 2, the robot 1 is provided with two hands 3, 4 on which a substrate 2 is mounted respectively, an arm 5 to which the hand 3 is rotatably joined to the front end thereof, an arm 6 to which the hand 4 is rotatably joined to the front end thereof, a main body section 7 to which the base ends of the arms 5, 6 are joined and an elevating mechanism (no illustration) for elevating the main body section 7. The main body section 7 and the elevating mechanism are stored in a case 13 formed in a cylindrical shape with a bottom. To the top edge of the case 13, a disk-shaped flange 14 is fixed. Formed in the flange 14 is a through hole in which the upper end side of the main body section 7 is placed.

The hands 3, 4 and the arms 5, 6 are arranged above the main body section 7. The hands 3, 4 and the arms 5, 6 are also arranged above the flange 14. The robot 1 is for transferring a substrate 2 in vacuo, as mentioned above; as shown in FIG. 2, the section of the robot 1 above the bottom edge surface of the flange 14 is placed in the vacuum room VR (in vacuo). Meanwhile, the section of the robot 1 below the bottom edge surface of the flange 14 is placed in an ambient room AR (in the air).

The arm 5 is configured by a first arm section 16 and a second arm section 17. Also, the arm 6 is configured by the first arm section 16, which is shared by the arm 5, and a second arm section 18. The first arm section 16 is forked. More specifically described, the first arm section 16 is formed in a V-shape. The first arm section 16 and the second arm sections 17, 18 are formed of aluminum alloy.

The base end of the first arm section 16 is rotatably held by the main body section 7. To one of the front ends of the forked, first arm section 16, the second arm section 17 is rotatably held; to the other front ends of the first arm section 16, the second arm section 18 is rotatably held. The hand 3 is rotatably held to the front end of the second arm section 17, and the hand 4 is rotatably held to the front end of the second arm section 18.

A connecting section between the arms 5, 6 and the main body section 7 (i.e., a connecting section between the first arm section 16 and the main body section 7) is made as a first joint 20. In the first joint 20, a magnetic fluid seal (no illustration) is arranged to prevent air from entering the vacuum room VR. A connecting section between the first arm section 16 and the second arm section 17 is made as a second joint 21 and a connecting section between the first arm section 16 and the second arm section 18 is made as a second joint 22. In the second joint 21, a rolling bearing (no illustration) is arranged to rotatably support the second arm 17 to rotate; in the second joint 22, a rolling bearing (no illustration) is arranged to rotatably support the second arm section 18.

In this embodiment, as shown in FIG. 2, the second arm sections 17, 18 are so arranged to be above the first arm section 16 when viewed in the horizontal direction. Also, the second arm section 18 is arranged to be above the second arm section 17. The hands 3, 4 are so arranged to be between the second arm section 17 and the second arm section 18 when viewed in the horizontal direction. More specifically, the hand 3 is connected on the top face side of the second arm section 17 and the hand 4 is connected on the bottom face side of the second arm section 18; the hand 4 is so arranged to be above the hand 3 when viewed in the horizontal direction. Note that, when the arms 5, 6 are not outstretched, the hand 3 and the hand 4 are in an overlapping position when the robot 1 is viewed from the top, as shown in FIG. 1 (B).

With the arm 5 and/or the arm 6 outstretched, the robot 1 mounts a substrate 2 inside a transfer rack, which is not illustrated, and transfers the substrate 2 out of the transfer rack while folding in the arm 5 and/or the arm 6. Then, the robot 1 changes its direction and transfers the substrate 2 into a pressure-reduced, high temperature chamber (a high temperature vacuum chamber).

The hand 3, 4 is configured by multiple fork prongs 25 (four prongs, for example) for mounting a substrate 2 and a hand base section 26 to which the base ends of the multiple fork prongs 25 are fixed and which is rotatably held at the front end of the second arm section 17, 18. The fork prong 25 consists of a fork prong front section 27 on which a substrate 2 is mounted and a fork prong base section 28 to which the base end of the fork prong front section 27 is fixed. The fork prong front section 27 configures the front side of the fork prong 25, and the fork prong base section 28 configures the base side of the fork prong 25. The fork prong front section 27 of this embodiment is an object-mounting section on which a substrate 2, an object-to-be-transferred, is mounted.

As shown in FIG. 3 through FIG. 6, a covering member 30 is attached to the fork prong front section 27 to cover the top surface and side surface of the fork prong front section 27. Hereinafter, more specific configuration of the hand 3 and the covering member 30 is described. Note that the hand 4 is configured in the same way as the hand 3; therefore, a more detailed description of the hand 4 is omitted. Also, in FIG. 1 and FIG. 2, the illustration of the covering member 30 is omitted.
(Configurations of Hand and Covering Member)

Figure 3:
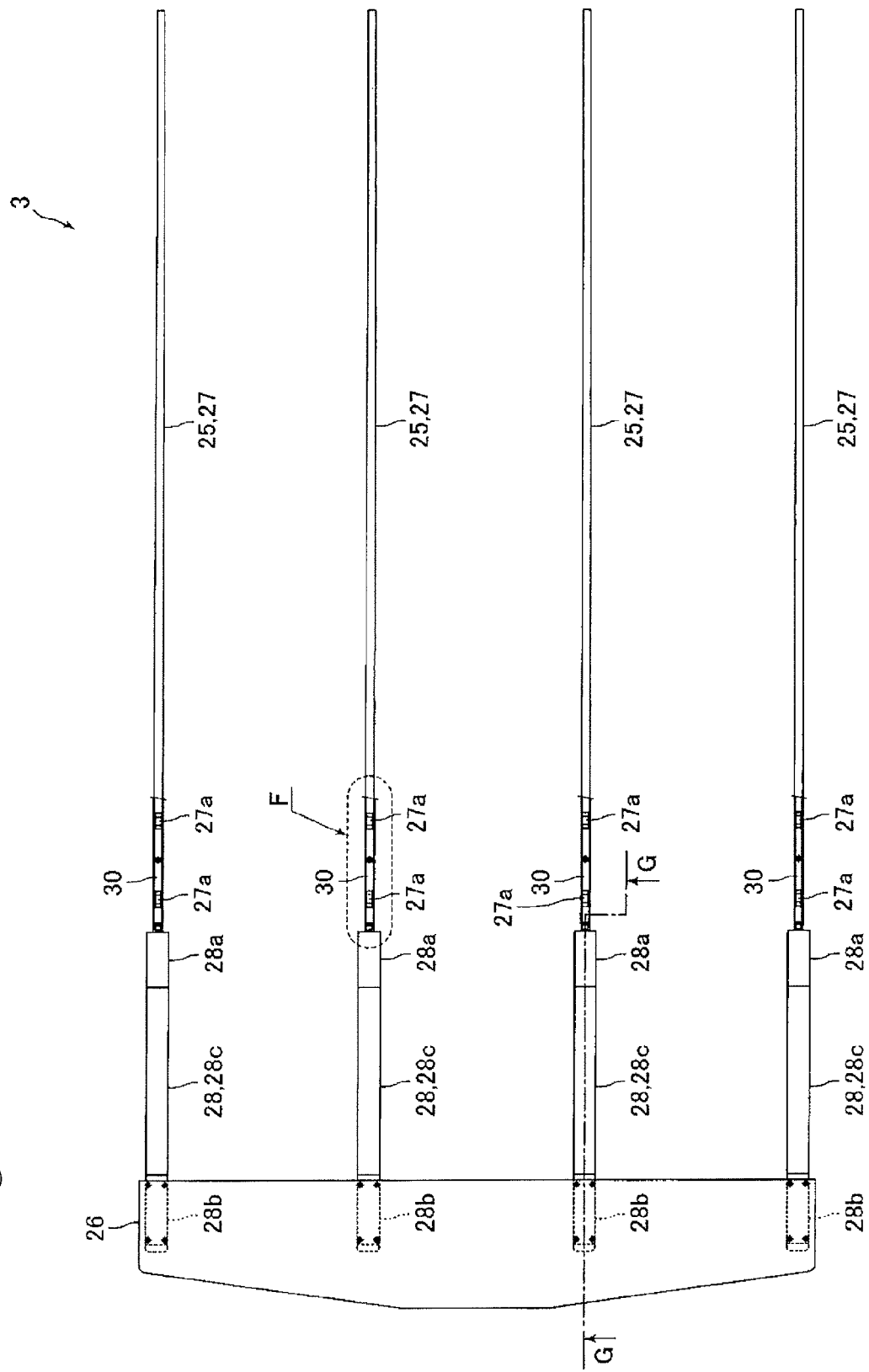
FIG. 3 is a plan view of a hand shown in FIGS. 1(A) and 1(B).
Figure 5:
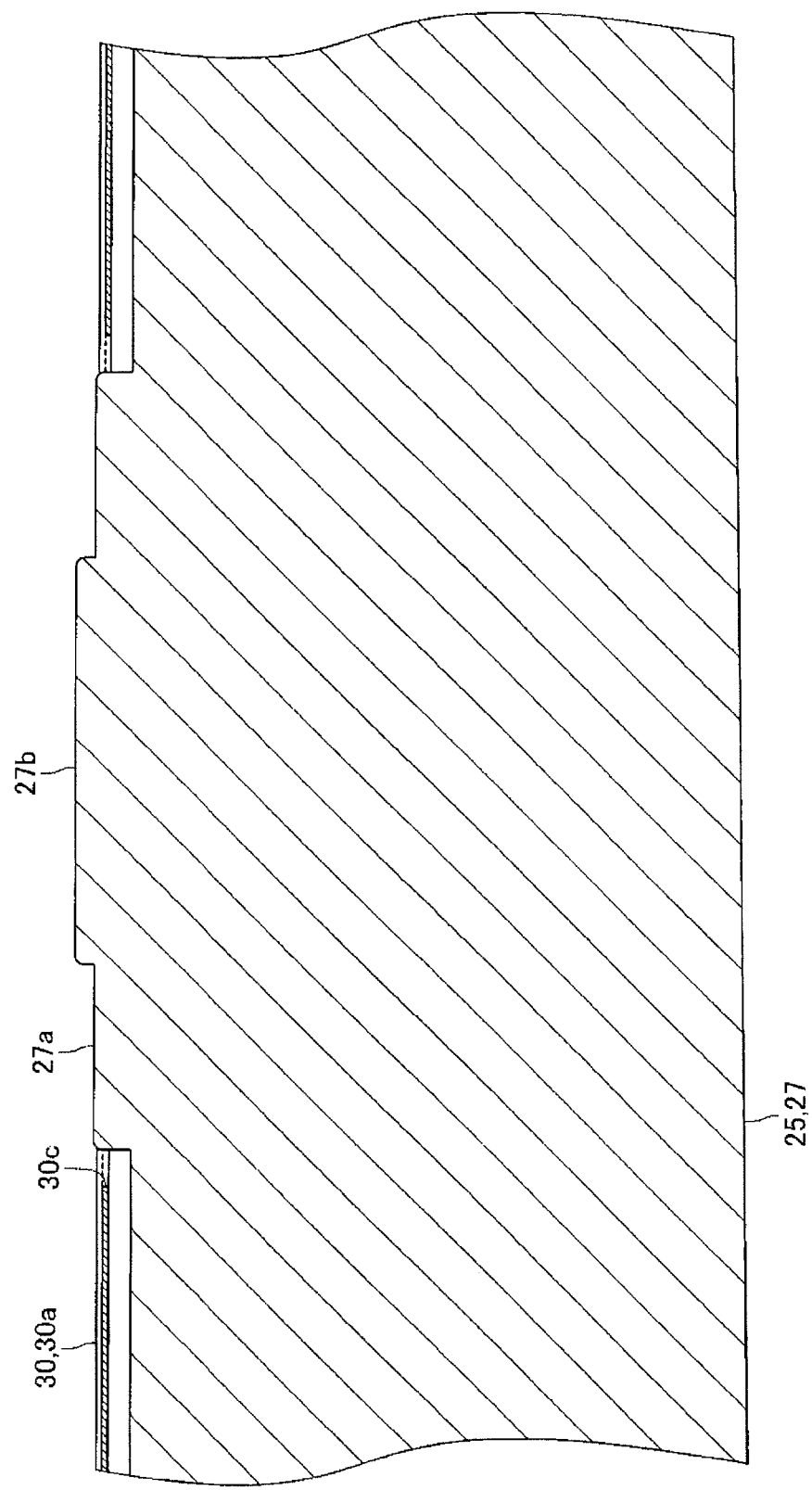
FIG. 5 is a cross-sectional view of the H-H cross-section of FIG. 4 (A).
Figure 6:
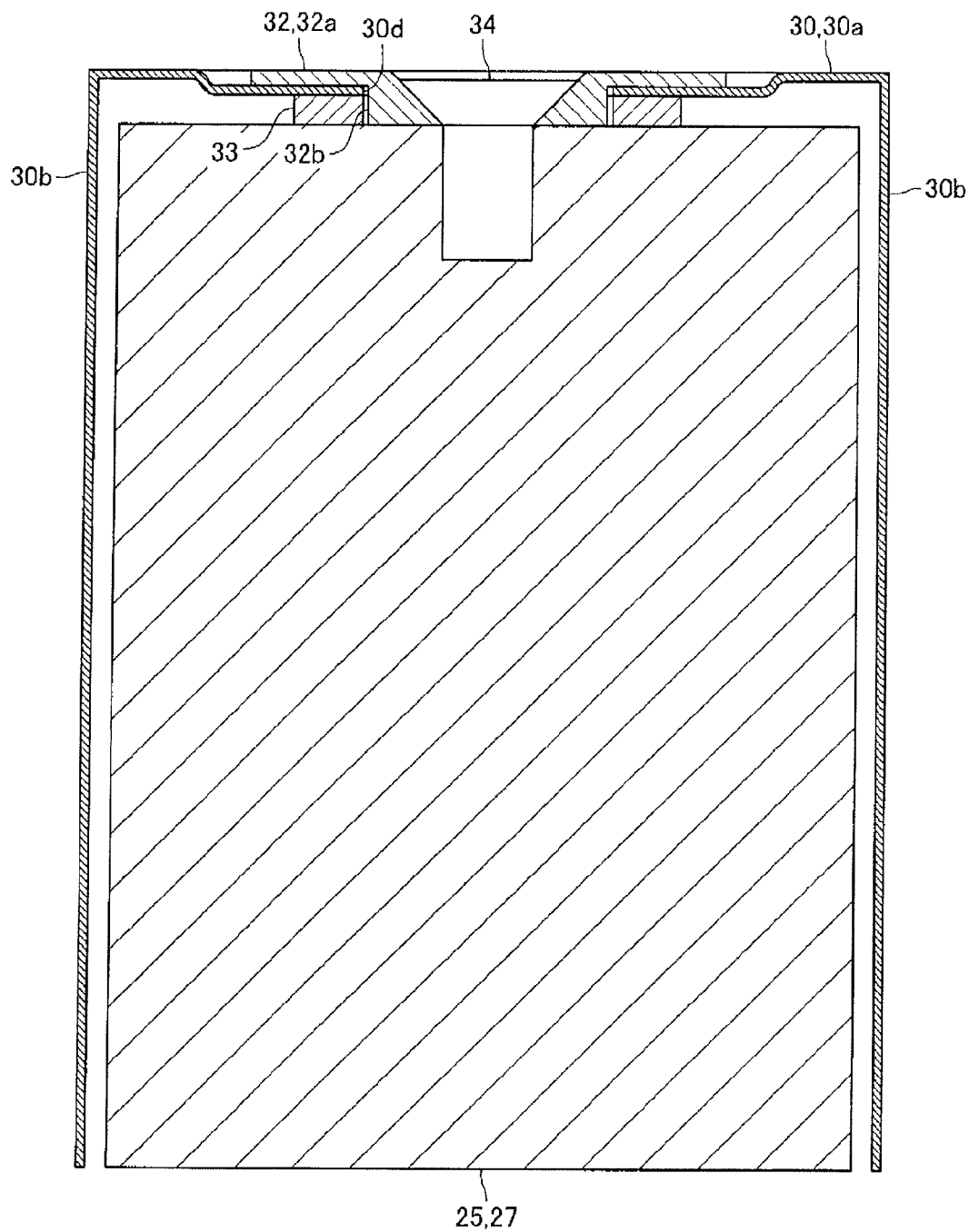
FIG. 6 is a cross-sectional view of the J-J cross-section of FIG. 4 (A).

FIG. 3 is a plan view of the hand 3 of FIG. 1. FIG. 4 (A) is a blowup of F section of FIG. 3; FIG. 4 (B) is a cross-sectional view of G-G cross-section of FIG. 3. FIG. 5 is a cross-sectional view of H-H cross-section of FIG. 4 (A). FIG. 6 is a cross-sectional view of J-J cross-section of FIG. 4 (A).

As described above, the hand 3 consists of the fork prongs 25 and the hand base section 26; the fork prong 25 is configured by the fork prong front section 27 and the fork prong base section 28.

The fork prong front section 27 is formed of ceramic. The fork prong front section 27 is formed of solid ceramic and there is no space inside. Also, the fork prong front section 27 is formed in a thin, long rectangular prism shape. Multiple protrusions 27a are formed in the top surface of the prong front section 27 to protrude upwardly. The multiple protrusions 27a are formed at a predetermined pitch in the longitudinal direction. Also, the multiple protrusions 27a are formed over the entire area of the fork prong front section 27 in the longitudinal direction of the fork prong 25. Further, on the top surface of the base end side of the fork prong front section 27, a positioning protrusion 27c for positioning a substrate 2 in the longitudinal direction is formed protruding upwardly. Note that FIG. 3 shows only some of the multiple protrusions 27a.

The shape of the protrusion 27a when viewed from the top is a rectangular shape which is long in the longitudinal direction of the fork prong 25. The top face 27b of the protrusion 27a is formed to be in a plane. The top face 27b is positioned above the top surface of a top face section 30a configuring the covering member 30, which will be described later. The top face 27b is an object-mounting surface on which a substrate 2 is mounted and with which the bottom surface of the substrate 2 makes contact. The positioning protrusion 27c is formed in a step so that the bottom surface of the substrate 2 and the edge of the substrate 2 make contact with it. Note that the protrusion 27a and the positioning protrusion 27c may be formed as a separate body from the fork prong front section 27 but fixed to the fork prong front section 27.

The fork prong base section 28 is configured by a first fixing section 28a to which the fork prong front section 27 is fixed, a second fixing section 28b which is fixed to the hand base section 26, and a connecting section 28c which connects the first fixing section 28a and the second fixing section 28b, and is formed in a rectangular prism as a whole. The length of the fork prong base section 28 is shorter than the length of the fork prong front section 27. Also, the thickness of the fork prong base section 28 is more than the thickness of the fork prong front section 27. The width of the fork prong base section 28 is wider than the width of the fork prong front section 27.

The connecting section 28c is formed of a stainless steel pipe shaped into a body with space inside. The connecting section 28c is thin to be about 4 mm thick. The first fixing section 28a and the second fixing section 28b are formed of stainless steel and shaped into a rectangular parallelepiped to conform to the exterior shape of the fork prong 25. The first fixing section 28a and the connecting section 28c are soldered to each other; the second fixing section 28b and the connecting section 28c are also soldered to each other. Note that the first fixing section 28a and the connecting section 28c may be fixed to each other by adhesive or may be fixed to each other by using a bolt, etc. In the same manner, the second fixing section 28b and the connecting section 28c may be fixed to each other by a method other than soldering. For example, the second fixing section 28b and the connecting section 28c may be fixed to each other by adhesive or by using a bolt, etc.

As shown in FIG. 4 (B), a recess 28d is created in the bottom surface of the first fixing section 28a so that the base end side of the fork prong front section 27 is arranged therein; the base end side of the fork prong front section 27 is fixed to the first fixing section 28a while placed in the recess 28d. In the second fixing section 28b, a through hole 28e connected to the space inside the connecting section 28c is formed. The second fixing section 28b is, while placed in the recess 26a created in the bottom surface of the hand base section 26, fixed to the hand base section 26. The hand base section 26 is formed of aluminum alloy or stainless steel.

The covering member 30 is formed of a thin stainless steel sheet. Also, the covering member 30 is formed by bending the stainless steel sheet into a rectangular groove, and is provided with a top face section 30a covering the top surface of the fork prong front section 27 and two side face sections 30b covering the side surface of the fork prong front section 27. As shown in FIG. 6, the top face section 30a is bent such that the inner portion of the top face section 30a in the direction perpendicular to the longitudinal direction of the fork prong 25 is positioned slightly lower than the two end portions of the top face section 30a. The two side face sections 30b are formed so as to be respectively connected to each end of the top face section 30a in the direction perpendicular to the longitudinal direction of the fork prong 25.

In the top face section 30a, multiple positioning holes 30c are formed to have the protrusions 27a of the fork prong front section 27 be placed. The multiple positioning holes 30c are formed at a predetermined pitch in the longitudinal direction of the fork prong 25. The positioning holes 30c are formed through the top face section 30a, and the top ends of the protrusions 27a protrude above the top face section 30a. The shape of the positioning hole 30c when viewed from the top is a rectangular shape long in the longitudinal direction of the fork prong 25. The width of the positioning hole 30c in the longitudinal direction of the fork prong 25 is wider than that of the protrusion 27a in the longitudinal direction of the fork prong 25.

Also, multiple through holes 30d are created in the top face section 30a to mount the covering member 30 to the fork prong front section 27. The multiple through holes 30d are formed at a predetermined pitch in the longitudinal direction of the fork prong 25. The through holes 30d are formed passing through the top face section 30a. The shape of the through hole 30d when viewed from the top is an oval shape elongated in the longitudinal direction of the fork prong 25.

The covering member 30 is attached to the fork prong front section 27 by a collar 32, a spacer 33 and a countersunk screw 34, as shown in FIG. 6. The collar 32 is formed in a cylindrical shape having a flat brim consisting of a brim portion 32a and a cylinder portion 32b. The spacer 33 is formed in a flat cylindrical shape. The cylinder portion 32b is placed in the through hole 30d of the covering member 30; the bottom end of the cylinder portion makes contact with the top surface of the fork prong front section 27. The brim portion 32a is arranged above the top face section 30a. The spacer 33 is arranged outside the circumference of the cylinder portion 32b such that the top face thereof makes contact with the bottom surface of the top face section 30a. The inside circumferential surface of the collar 32 is a slanted surface which engages with the head portion of the countersunk screw 34; with the countersunk screw 34 screwed into the screw hole formed in the top surface of the fork prong front section 27, the covering member 30 is fixed to the fork prong front section 27. Note that, in this embodiment, the bottom surface of the brim portion 32a makes light contact with the top surface of the top face section 30a or a small gap is created between the bottom surface of the brim portion 32a and the top surface of the top face section 30a.

As described above, the bottom surface of the spacer 33 makes contact with the top surface of the fork prong front section 27 and the top surface of the spacer 33 makes contact with the bottom surface of the top face section 30a; therefore, a gap is created between the top surface of the fork prong front section 27 and the bottom surface of the top face section 30a. The width of the top face section 30a in the direction perpendicular to the longitudinal direction of the fork prong 25 is wider than that of the fork prong front section 27 in this direction and a gap is created between the side surface of the fork prong front section 27 and the side face section 30b. The width of the side face section 30b in the top-bottom direction is equal to the thickness of the fork prong front section 27 in the top-bottom direction; the side face section 30b covers almost the entire area of the side surface of the fork prong front section 27. Also, the top face section 30a covers almost the entire area of the top surface of the fork prong front section 27 except the protrusions 27a and the positioning protrusions 27c.

In this embodiment, the radiant heat reflectance at the covering member 30 and the radiant heat reflectance at the fork prong base section 28 are higher than the radiant heat reflectance of the fork prong front section 27. As described above, also, the covering member 30 and the fork prong base section 28 are formed of stainless steel and the fork prong front section 27 is formed of ceramic; therefore, the heat conductivity of the covering member 30 and the heat conductivity of the fork prong base section 28 are lower than that of the fork prong front section 27. Also, the specific gravity of the fork prong front section 27 is smaller than those of the covering member 30 and the fork prong base section 28.

(Major Effects of this Embodiment)

As described above, in this embodiment, the radiant heat reflectance at the covering member 30 is higher than the radiant heat reflectance at the fork prong front section 27, and the heat conductivity of the covering member 30 is lower than that of the fork prong front section 27. Therefore, in this embodiment, the amount of heat transmitted from the substrate 2 to the fork prong front section 27 through radiant heat transfer can be reduced by the use of the covering member 30. In particular, in this embodiment, the covering member 30 covers, in addition to the top surface of the fork prong front section 27, almost the entire area of the side surface of the fork prong front section 27; therefore, the amount of heat that is transmitted from the substrate 2 to the fork prong front section 27 through radiant heat transfer can effectively be reduced. Further, in this embodiment, a gap is created between the top surface of the fork prong front section 27 and the bottom surface of the top face section 30a, and a gap is created between the side surface of the fork prong front section 27 and the side face section 30b; therefore, the heat conduction passage from the covering member 30 to the fork prong front section 27 is through the collar 32 and the spacer 33, and accordingly, the heat transmitted from the substrate 2 to the covering member 30 through radiant heat transfer can be suppressed from being transmitted to the fork prong front section 27 through heat conduction.

Therefore, in this embodiment, the amount of heat that is transmitted from the substrate 2 to the arms 5, 6 through heat conduction via the hands 3, 4 can be reduced. Consequently, in this embodiment, even when a substrate with a large amount of heat is to be transferred, the rolling bearings arranged in the second joint sections 21, 22 are kept from wear and damage resulting from the effects of heat, and also deformation of the arms 5, 6 resulting from the effects of heat can be suppressed.

In this embodiment, the connecting section 28c of the fork prong base section 28 is formed hollow and the cross-sectional area of the connecting section 28c is small. In other words, in this embodiment, the heat conduction passage in the connecting section 28c is narrow. Therefore, in this embodiment, the amount of heat that is transmitted from the fork prong front section 27 to the hand base section 26 through heat conduction can effectively be reduced; as a result, the amount of heat that is transmitted from the hands 3, 4 to the arms 5, 6 through heat conduction can effectively be reduced.

Further, in this embodiment, the radiant heat reflectance at the fork prong base section 28 is higher than that at the fork prong front section 27, and also the heat conductivity of the fork prong base section 28 is lower than that of the fork prong front section 27. For this reason, even if the fork prong base section 28 is not covered by the covering member 30, the amount of heat to be transmitted from the substrate 2 to the hand base section 26 through radiant heat transfer can be reduced; as a result, the amount of heat that is transmitted from the substrate 2 to the arms 5, 6 through heat conduction via the hands 3, 4 can effectively be reduced.

In this embodiment, the specific gravity of the fork prong front section 27 is smaller than that of the covering member 30. Therefore, in this embodiment, even if the hands 3, 4 are made larger in order to transfer a relatively large substrate 2, the weight of the hands 3, 4 can be reduced. In other words, even when the fork prong front section 27 is formed of stainless steel which is the same material as of the covering member 30, the amount of heat that is transmitted from the substrate 2 to the arms 5, 6 through heat conduction via the hands 3, 4 can be reduced. In this case, the hands 3, 4 made larger in order to transfer a relatively large substrate 2 have heavier weight. In this embodiment, however, even when the hands 3, 4 are made larger, the weight thereof can be reduced. Also, the coefficient of linear expansion of stainless steel is larger than that of ceramic; therefore, if the fork prong front section 27 is formed of stainless steel, it is easily deformed by heat; however, the fork prong front section 27 of this embodiment is formed of ceramic, which facilitates suppressing heat deformation of the fork prong front section 27.

In this embodiment, the connecting section 28c of the fork prong base section 28 is formed of a stainless steel pipe. Therefore, while the weight of the connecting section 28c is reduced, the rigidity thereof is still maintained in this embodiment.

In this embodiment, the width of the positioning hole 30c in the covering member 30 in the longitudinal direction of the fork prong 25 is wider than the width of the protrusion 27a of the fork prong front section 27 in the longitudinal direction of the fork prong 25. Further, in this embodiment, the bottom surface of the brim portion 32a makes light contact with the top surface of the top face section 30a, or a minute gap is created between the bottom surface of the brim portion 32a and the top surface of the top face section 30a. Therefore, even when the coefficient of linear expansion of the fork prong front section 27 is different from that of the covering member 30, heat deformation of the fork prong front section 27 and the covering member 30, which is caused when a relatively high-temperature substrate 2 is mounted, can be suppressed in this embodiment.

(Other Embodiments)

The above-described embodiment is an example of preferred embodiments of the present invention; however, the embodiment is not limited to this, but can be varyingly modified within the scope of the present invention.

In the above-described embodiment, the covering member 30 covers almost the entire area of the side surface of the fork prong front section 27. Beside this, the covering member 30 may cover part of the side surface of the fork prong front section 27, or covers only the top surface of the fork prong front section 27 but not the side surface of the fork prong front section 27. Also, the covering member 30 may be configured so as to cover the bottom surface of the fork prong front section 27. Also, in the above-described embodiment, the covering member 30 is attached to the fork prong front section 27 using the spacer 33; however, the covering member 30 may be attached to the fork prong front section 27 without using the spacer 33. In this case, the bottom surface of the top face section 30a of the covering member 30 makes contact with the top surface of the fork prong front section 27.

Figure 7:
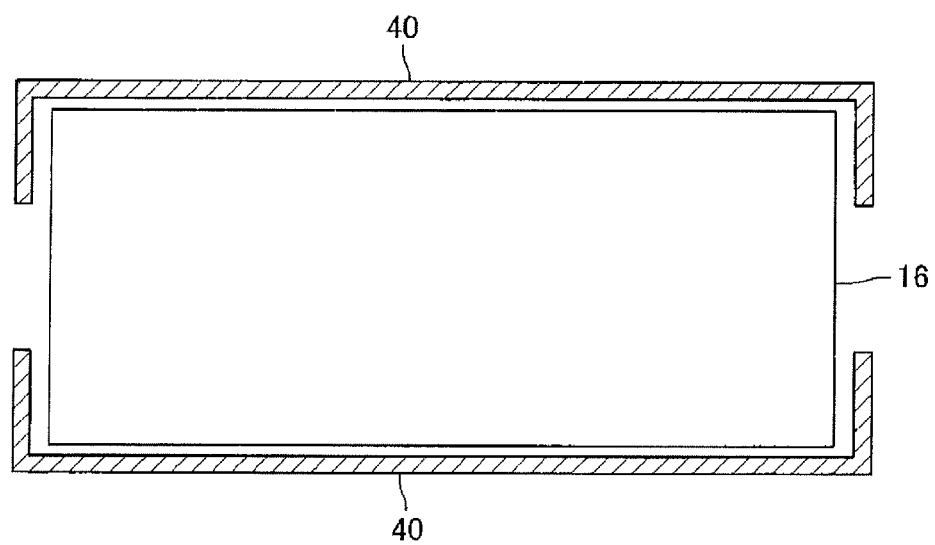
FIG. 7(A) is a view of a periphery of a first arm section of another embodiment of the present invention.
FIG. 7(B) is a view of a periphery of a second arm section of another embodiment of the present invention.
Figure 7:
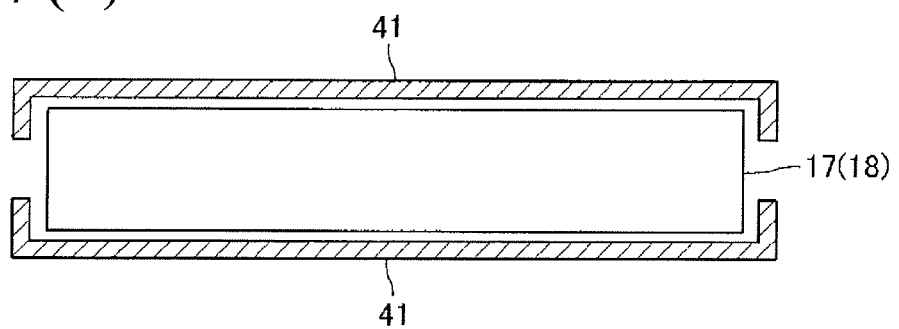

The top and bottom surfaces of the first arm section 16 of the above-described embodiment may be covered by a covering member 40 which is a second covering member having a lower heat conductivity than the first arm section 16, as shown in FIG. 7 (A). For example, the top and bottom surfaces of the first arm section 16 may be formed of a stainless steel sheet and be covered by two of the covering members 40 arranged interposing the first arm section 16 from the top-bottom direction. In the same manner, the top and bottom surfaces of the second arm sections 17, 18 may be covered by the covering member 41 which is a second covering member having a lower heat conductivity than the second arm sections 17, 18, as shown in FIG. 7 (B). For example, the top and bottom faces of the second arm sections 17, 18 may be covered by two of the covering members 41 formed of a stainless steel sheet and arranged to interpose the second arm sections 17, 18 in the top-bottom direction. In this case, the amount of heat that is transmitted from the substrate 2 to the arms 5, 6 through radiant heat transfer can be reduced because of the covering members 40, 41.

Note that, in this case, it is preferred that a gap be created between the covering members 40, 41 and the arms 5, 6 in order to suppress the heat transmission from the covering members 40, 41 to the arms 5, 6 through heat conductivity. Also, in this case, as shown in FIG. 7, the covering members 40, 41 may cover part of the side surfaces of the first arm section 16 and/or the second arm sections 17, 18; alternately the entire side surface of the first arm section 16 and/or the second arm sections 17, 18 may be covered. Also, the covering members 40, 41 may not cover the side surface of the first arm section 16 and/or the second arm sections 17, 18. Further, the first arm section 16 or/and the second arm sections 17, 18 may be covered by one of the covering members 40, 41 from the top.

In the above-described embodiment, the fork prong front section 27 that configures the front side of the fork prong 25 is an object-mounting section on which a substrate 2, an object-to-be-transferred, is mounted. Beside this, the entire fork prong 25 may be made to be an object-mounting section on which a substrate 2, an object-to-be-transferred, is mounted. In this case, the entire fork prong 25 is formed of solid ceramic and the entire fork prong 25 is covered by the covering member 30.

In the above-described embodiment, the fork prong front section 27 is formed of ceramic and the covering member 30 is formed of a stainless steel sheet. Beside this, the fork prong front section 27 may be formed of a material other than ceramic and the covering member be formed of a material other than stainless steel as long as the radiant heat reflectance at the covering member 30 is higher than that at the fork prong front section 27, the heat conductivity of the covering member 30 is lower than that of the fork prong front section 27, and the specific gravity of the fork prong front section 27 is smaller than that of the covering member 30. For example, the fork prong front section 27 may be formed of resin containing carbon fiber. When the fork prong front section 27 is formed of carbon-fiber reinforced resin, it is formed hollow, for example.

Although in the above-described embodiment, the connecting section 28c which is part of the fork prong base section 28 is formed hollow, the fork prong base section 28 may entirely be formed hollow. Also, the fork prong base section 28 may entirely be solid. In the above-described embodiment, the radiant heat reflectance at the fork prong base section 28 is higher than that at the fork prong front section 27; however, the radiant heat reflectance at the fork prong base section 28 may be lower than or equal to that at the fork prong front section 27. Also, the heat conductivity of the prong base section 28 is longer than that of the prong front section 27; however, the heat conductivity of fork prong base section 28 may be higher than or equal to that of the fork prong front section 27. Further, in the above-described embodiment, the specific gravity of the fork prong base section 28 is larger than the specific gravity of the fork front end section 27; however, the specific gravity of the fork prong base section 28 may be smaller than or equal to that of the fork prong front section 27.

In the above-described embodiment, the hands 3, 4 are provided with the fork prongs 25; however, the hands 3, 4 may not be provided with the fork prong 25. For example, the hands 3, 4 may be formed to appear in a Y-shape when viewed from the top, or may be formed to appear in a rectangular shape when viewed from the top as in the hands disclosed in the above-mentioned patent reference 1. In this case, the hands 3, 4 may respectively be provided with a hand front end section, which configures the front side of the hands 3, 4, and a hand base section, which configures the base side of the hands 3, 4; the hand prong front section may be formed of solid ceramic and the hand prong base section may be formed of a hollow stainless steel pipe.

In the above-described embodiment, the arm 6 consists of the first arm 16, which is shared by the arm 5, and the second arm 18; however, the arm 6 may be configured by a separate first arm, which is not the [shared] first arm 16, and the second arm 18. Also, in the above-described embodiment, the arms 5, 6 are respectively configured by the two arm sections, the first arm section 16 and the second arm sections 17, 18; however, the arms 5, 6 may respectively be configured by a single arm section or by three or more arm sections.

In the above-described embodiment, a substrate 2 is the object-to-be-transferred which is transferred by the robot 1; however, a semiconductor wafer may be the object-to-be-transferred which is transferred by the robot 1. Also, the robot 1 transfers a substrate 2 in vacuo, but the robot 1 may transfer the substrate 2 in atmosphere.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. An industrial robot for transferring an object-to-be-transferred, comprising:
   a hand having an object-mounting section on which said object-to-be-transferred can be mounted;
   an arm structured to hold said hand at a front side thereof;
   a main body section structured to hold a base end of said arm; and
   a covering member structured to cover at least a top surface of said object-mounting section;
   wherein a radiant heat reflectance at said covering member is higher than that at said object-mounting section,
   a heat conductivity of said covering member is lower than that of said object-mounting section, and
   a specific gravity of said object-mounting section is smaller than that of said covering member;
   wherein said hand is provided with multiple fork prongs and a hand base section to which base ends of said multiple fork prongs are fixed and which is held to the front side of said arm, and at least a front side of said fork prongs is said object-mounting section; and
   wherein said fork prong is provided with a fork prong front section as said object-mounting section and a fork prong base section on which the base end of said fork prong front section is fixed, and at least part of said fork prong base section is formed hollow.

2. The industrial robot as set forth in claim 1 wherein said covering member covers the top surface and a side surface of said object-mounting section.

3. The industrial robot as set forth in claim 1 wherein said object-mounting section is formed of ceramic and said covering member is formed of stainless steel sheet.

4. The industrial robot as set forth in claim 1 wherein the radiant heat reflectance at said fork prong base section is higher than that at said fork prong front section, the heat conductivity of said fork prong base section is lower than that of said fork prong front section, and the specific gravity of said fork prong front section is smaller than that of said fork prong base section.

5. The industrial robot as set forth in claim 1 wherein said fork prong front section is formed of ceramic and at least part of said fork prong base section is formed of a stainless steel pipe.

6. The industrial robot as set forth in claim 1, further comprising:
   a second covering member structured to cover at least a top surface of said arm;
   wherein the heat conductivity of said second covering member is lower than that of said arm.

7. The industrial robot as set forth in claim 1 wherein said object-to-be-transferred is a glass substrate for LCDs.

* * * * *